GATES INCLUDING (1) DIODES AND COMPLEMENTARY TRANSISTORS IN BRIDGE CONFIGURATION, AND (2) DIODES WITH PARALLELED COMPLEMENTARY TRANSISTORS

Filed March 7, 1960

Inventor
JOHN RYWAK
By Robert B. Harmon
Attorney

United States Patent Office 3,077,545
Patented Feb. 12, 1963

3,077,545

GATES INCLUDING (1) DIODES AND COMPLEMENTARY TRANSISTORS IN BRIDGE CONFIGURATION, AND (2) DIODES WITH PARALLELLED COMPLEMENTARY TRANSISTORS

John Rywak, Belleville, Ontario, Canada, assignor to Northern Electric Company, Limited, Montreal, Quebec, Canada, a corporation of Canada Filed Mar. 7, 1960, Ser. No. 13,169
2 Claims. (Cl. 307—88.5)

This invention relates to transmission gating circuits and more particularly to complementary transistor transmission gating circuits.

Transmission gating circuits composed of diodes, connected so that when a control voltage of a given polarity is applied to the circuit the signal passing through the circuit is either transmitted or blocked depending on the polarity of the control voltage, are known. However these circuits suffer in that the diodes being non-amplifying devices, the signal is attenuated and in addition the impedance characteristic of these circuits limits the magnitude of the load into which the output signal is applied. In order to avoid these difficulties, complementary transistor circuits have been developed, for example the circuit shown on page 1245 of the I.R.E. Proceedings, June 1958.

An object of this invention is to provide a complementary transistor transmission gating circuit having improved means to reduce the attenuation of the signal passing through the circuit.

Another object of this invention is to provide a complementary transistor transmission gating circuit having the foregoing characteristics having means to improve the magnitude of the load into which the signal is applied.

These and other objects of this invention are attained in one embodiment of the invention by providing a transmission gating circuit comprising a bridge circuit having two parallel branches, one branch containing a pair of diodes in serial relation poled in the same direction and the other a pair of transistors of the complementary type, each having an emitter, base and collector electrode, the emitter electrodes being connected together, with means for applying a control voltage of opposite polarity individually at the junction points of the two branches, and means to apply the input signal at the junction point of the two diodes, the output signal being applied to the load in emitter follower relation.

Figure 1:
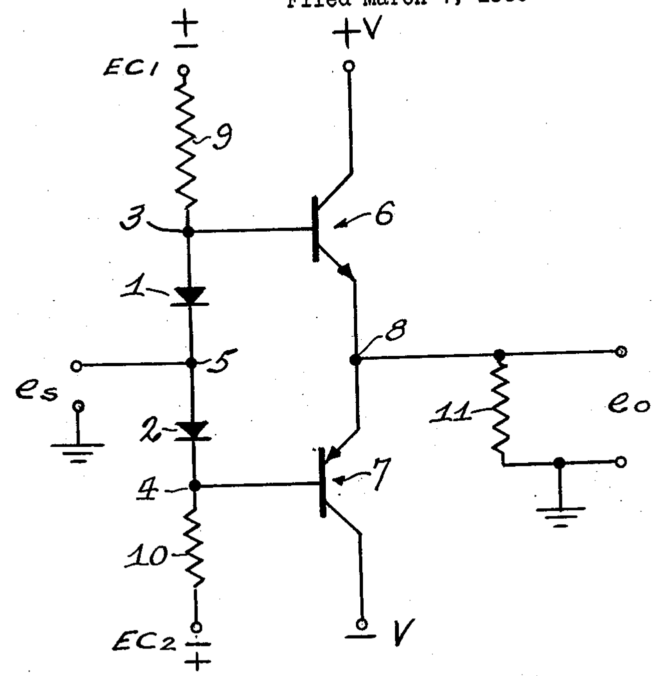
Figure 2:
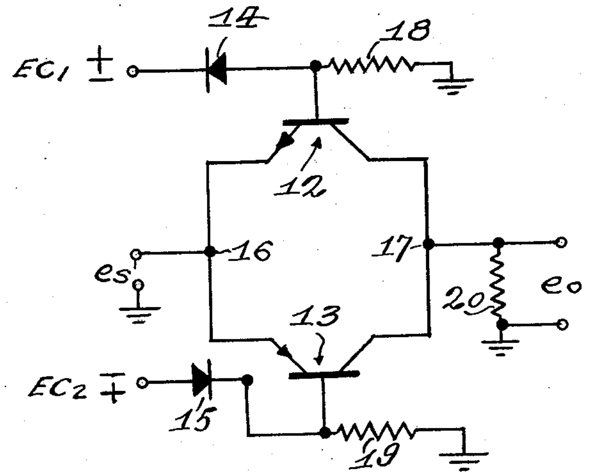

A better understanding of the invention may be obtained by referring to the following description, taken in conjunction with the drawings, in which:

FIGS. 1 and 2 illustrate different embodiments of the circuit schematic in which the invention is represented.

Considering the drawings, there is shown in FIG. 1 a bridge circuit having two parallel branches one of which comprises diodes 1, 2 connected in series relation, poled in the same direction across a pair of junction points 3, 4 the junction point between the diodes being at 5. The other branch contains transistors 6, 7 of the complementary type, each having a base, emitter and collector electrodes, with their emitter electrodes connected together, the junction point between the transistors 6, 7 being shown at 8, and the base electrodes of the transistors 6, 7 being connected to the junction points 3, 4.

Resistors 9, 10 are current limiting resistors and resistor 11 the load resistor, the output signal being applied to the load in emitter follower relation.

In FIG. 2, there is shown transistors 12, 13 of the complementary type, each having a base, emitter and collector electrodes, the emitter and collector electrodes being individually connected together to form a bridge circuit, the junction points between the branches being shown at 16, 17 respectively.

Also shown are diodes 14, 15 connected to the base electrodes of the transistors 12, 13 poled in the same conductive direction. Resistors 18, 19 are current limiting resistors and resistor 20 the load resistor, the output signal being applied to the load in collector follower relation.

Typical values for the components of the described circuit are:

Resistors 9, 10, 18, 19=56K
Resistors 11, 20=5.6K
$+V=+10$ volts
$-V=-10$ volts
$E_{c1}=\pm 10$ volts
$E_{c2}=\pm 10$ volts
$e_s<E_c<V$ In the operation of the circuit illustrated in FIG. 1, assume a direct current positive and negative voltage is applied through resistors 9, 10 to the diodes 1, 2 respectively. Under these conditions diodes 1, 2 and transistors 6, 7 conduct so that the output signal $e_0$ follows the excursions of the input signal $e_s$. Since the output impedance in relation to the input impedance, with respect to reference points 5, 8 is small, a power gain is obtained as regards the output signal $e_0$.

If the control voltages $E_{c1}$ and $E_{c2}$ are now interchanged, i.e. $E_{c1}$ being negative and $E_{c2}$ positive, diodes 1 and 2 become reverse-biased and the emitter-base junctions of both transistors also become reverse-biased. The input signals $e_s$ and output resistor 11 are now both disconnected from the transmission gate and each other.

In the operation of the circuit illustrated in FIG. 2, assume that a direct current positive and negative voltage is applied to the diodes 14, 15 respectively. Under these conditions these diodes 14, 15 and transistors 12, 13 conduct resulting in the same conditions as described with regard to the circuit illustrated in FIG. 1.

Blocking action will take place if $E_{c1}$ is made negative and $E_{c2}$ positive. In this instance diodes 14 and 15 will be forward-biased but the emitter-base junctions will be reverse-biased. If $E_{c1}$ is made positive and $E_{c2}$ negative the diodes 14 and 15 will be reverse-biased but resistors 18 and 19 will cause the emitter-base junctions to be forward-biased and allow the transistor base currents to flow when the transmission gate is in operation.

What is claimed is:

1. A transmission gating circuit comprising a bridge circuit having two parallel branches one of which includes a pair of diodes connected in series aiding across a pair of junction points of the bridge circuit, the other branch including a pair of transistors of the complementary type, provided with base, emitter and collector electrodes, having their emitter electrodes connected together and their base electrodes individually connected to the junction points, means for applying individually to the junction points a direct current of equal and opposite polarity, biasing means connected to the transistors, means for applying an input signal between the junction point of the diodes and ground, means for connecting an output load between the junction points of the emitter electrodes and ground.

2. A transistor gating circuit comprising a PNP and an NPN transistor parallel having the emitter and collector electrodes of the separate transistors respectively coupled together, a first and second diode, the anode of the first being connected to the base of the NPN transistor and the cathode of the second being connected to the base of the PNP transistor, means for applying individually a direct current of equal and opposite polarity to the cathode and anode of the first and second diode respectively, means for applying an input signal between the junction points of the emitter electrodes and ground, means for connecting an output load betwen the junction point of the collector electrode and ground.

References Cited in the file of this patent

UNITED STATES PATENTS

| | | |
|---|---|---|
| 2,802,067 | Zawels | Aug. 6, 1957 |
| 2,864,961 | Lohman et al. | Dec. 16, 1958 |
| 2,887,619 | Hussey et al. | May 19, 1959 |